United States Patent
Takizawa

(10) Patent No.: US 7,350,123 B2
(45) Date of Patent: Mar. 25, 2008

(54) TEST APPARATUS, CORRECTION VALUE MANAGING METHOD, AND COMPUTER PROGRAM

(75) Inventor: Shigeki Takizawa, Tokyo (JP)

(73) Assignee: Advantest Corporation, Tokyo (JP)

( * ) Notice: Subject to any disclaimer, the term of this patent is extended or adjusted under 35 U.S.C. 154(b) by 279 days.

(21) Appl. No.: 10/913,763

(22) Filed: Aug. 6, 2004

(65) Prior Publication Data

US 2005/0034043 A1  Feb. 10, 2005

(30) Foreign Application Priority Data

Aug. 6, 2003  (JP) .............................. 2003-287376

(51) Int. Cl.
*G01R 31/28* (2006.01)
(52) U.S. Cl. ........................................ 714/734; 702/85
(58) Field of Classification Search ................ 375/286; 324/158.1; 702/86, 85; 356/330; 358/1.9, 358/474; 714/734
See application file for complete search history.

(56) References Cited

U.S. PATENT DOCUMENTS

| | | | |
|---|---|---|---|
| 5,712,855 A | | 1/1998 | Goto et al. |
| 5,793,815 A | * | 8/1998 | Goodnow et al. .......... 375/286 |
| 5,884,236 A | | 3/1999 | Ito |
| 6,496,000 B1 | * | 12/2002 | Jang ........................ 324/158.1 |
| 6,549,866 B1 | * | 4/2003 | Bhatnagar .................... 702/86 |
| 6,573,990 B1 | * | 6/2003 | Anderson .................... 356/330 |
| 7,061,648 B2 | * | 6/2006 | Nakajima et al. ............. 358/1.9 |
| 7,064,871 B2 | * | 6/2006 | Yamagata et al. ............ 358/474 |

FOREIGN PATENT DOCUMENTS

| | | |
|---|---|---|
| EP | 0 566 823 A2 | 10/1993 |
| JP | 6-148279 | 5/1994 |
| JP | 10-105385 | 4/1998 |
| JP | 2000-137057 | 5/2000 |
| JP | 2001-124817 | 5/2001 |

(Continued)

OTHER PUBLICATIONS

Patent Abstracts of Japan, Publication No.: 06-148279, Publication Date: May 27, 1994, 1 page.

(Continued)

*Primary Examiner*—David Ton
(74) *Attorney, Agent, or Firm*—Osha Liang LLP

(57) ABSTRACT

A test apparatus includes a test module including a correcting unit for correcting the timing at which the test signal is to be supplied to the device under test or a voltage level of the test signal to the device under test, a correction value holding unit for holding a correction value used for a correction by the correcting unit, and an identification information storing unit for storing test module identification information, which is identification information of the test module, a correction value database for storing the correction value to be held by the correction value holding unit of the test module identified by the test module identification information, in order that the correction value corresponds to the test module identification information, and control means for retrieving the correction value stored by the correction value database, wherein the correction value corresponds to the test module identification information stored by the identification information storing unit, and controlling the correction value holding unit to hold the correction value.

13 Claims, 7 Drawing Sheets

FOREIGN PATENT DOCUMENTS

WO    WO-02/075343 A1    9/2002

OTHER PUBLICATIONS

Patent Abstracts of Japan, Publication No.: 2000-137057, Publication Date: May 16, 2000, 1 page.
Patent Abstracts of Japan, Publication No.: 2001-124817, Publication Date: May 11, 2001, 1 page.
Patent Abstracts of Japan, Publication No.: 10-105385, Publication Date: Apr. 24, 1998, 1 page.
Supplementary European Search Report issued in European Application No. EP 04 74 8125 dated Jul. 18, 2006, 3 pages.
International Search Report issued in International Application No. PCT/JP2004/010964 mailed on Nov. 16, 2004 and English translation thereof, 4 pages.

* cited by examiner

TEST APPARATUS, CORRECTION VALUE MANAGING METHOD, AND COMPUTER PROGRAM

BACKGROUND OF THE INVENTION

The present application claims priority from a Japanese Patent Application No. 2003-287376 filed on Aug. 6, 2003, the contents of which are incorporated herein by reference.

1. Field of the Invention

The present invention relates to a test apparatus, a correction value managing method, and a computer program. More particularly, the present invention relates to a test apparatus for testing a device under test with high precision by correcting the timing at which a test signal is supplied to the device under test or the voltage level of the test signal to the device under test for each of test modules.

2. Decription of the Related Art

In a conventional test apparatus, there has been an attempt to improve measurement accuracy in the test of a device under test by performing calibration on a timing generator for generating the timing at which a test signal is supplied to the device under, a driver for sending and/or receiving the test signal to and/or from the device under test, a comparator, etc. before the test of a device under test. Since the prior art documents have not been known yet, they will not described.

In the conventional test apparatus, a test module performs the test, holding the calibration data about the timing generator, the driver, the comparator, etc. in a volatile memory. Accordingly, when the power of the test apparatus is off, the calibration data is lost from the test module. Therefore, when performing the test next time, a user of the test apparatus artificially selects and retrieves proper calibration data and supplies the data to the test module to hold them. In this method, an artificial miss might happen in selecting the calibration data and the test of the device under test might not be performed with high precision.

SUMMARY OF THE INVENTION

Therefore, it is an object of the present invention to provide a test apparatus, a correction value managing method, and a computer program, which is capable of overcoming the above drawbacks accompanying the conventional art. The above and other objects can be achieved by combinations described in the independent claims. The dependent claims define further advantageous and exemplary combinations of the present invention.

According to a first aspect of the present invention, a test apparatus for testing a device under test includes a test module including a correcting unit for correcting the timing at which the test signal is to be supplied to the device under test or a voltage level of the test signal to the device under test, a correction value holding unit for holding a correction value used for a correction by the correcting unit, and an identification information storing unit for storing test module identification information, which is identification information of the test module, a correction value database for storing the correction value to be held by the correction value holding unit of the test module identified by the test module identification information, in order that the correction value corresponds to the test module identification information, and control means for retrieving the correction value stored by the correction value database, wherein the correction value corresponds to the test module identification information stored by the identification information storing unit, and controlling the correction value holding unit to hold the correction value.

The test module may further include a timing generating unit for generating the timing at which the test signal is to be supplied to the device under test, the correction value holding unit may include a timing setting memory for holding timing data indicating predetermined timing and a timing calibration memory for holding timing calibration data to adjust the timing data, so that the test signal can be supplied to the timing generating unit at the predetermined timing, and the correcting unit may include a timing correcting unit for correcting the timing generated by the timing generating unit, based on the timing data and the timing calibration data as the correction value.

The test module may further include a driver for transferring the test signal to the device under test or a comparator for receiving the output signal from the device under test, the correction value holding unit may include a level setting memory for holding level data indicating a predetermined setting voltage and a level calibration memory for holding level calibration data to adjust the level data, so that the driver or comparator can operate with the predetermined setting voltage, and the correcting unit may include a level correcting unit for correcting the setting voltage of the driver or comparator based on the level data and the level calibration data as the correction value.

The identification information storing unit may further store test apparatus identification information which is identification information of the test apparatus, the correction value database may store the correction value in order that the correction value corresponds to the test module identification information and the test apparatus identification information, and the control means may retrieve the correction value stored by the correction value database, wherein the correction value corresponds to the test module identification information and the test apparatus identification information stored by the identification information storing unit, and control the correction value holding unit to hold the correction value.

The correcting unit may further include a plurality of slots for detachably holding a test board on which the correction value holding unit and the identification information storing unit are provided, the identification information storing unit may further store slot identification information which is identification information of the slot holding the test board, the correction value database may store the correction value in order that the correction corresponds to the test module identification information and the slot identification information, and the control means may retrieve the correction value stored by the correction value database, wherein the correction value corresponds to the slot identification information and the test apparatus identification information stored by the identification information storing unit, and control the correction value holding unit to hold the correction value.

The identification information storing unit may further store an error flag indicating whether an error occurs or not in generating the correction value to be held by the correction value holding unit, and the control means may generate a new correction value if the identification information storing unit stores the error flag indicating that an error has occurred in generating the correction value, when the correction value is retrieved from the correction value database based on the test module identification information stored by the identification information storing unit.

The identification information storing unit may further store a generation time indicating the time when the correction value to be held by the correction value holding unit is generated, and the control means may generate a new correction value if a predetermined period of time has passed from the generation time, when the correction value is retrieved from the correction value database based on the test module identification information stored by the identification information storing unit. The control means may generate a new correction value, when the correction value corresponding to the test module identification information stored by the identification information storing unit is not stored in the correction value database. The correction value holding unit may be a volatile memory, and the identification information storing unit may be a non-volatile memory.

According to a second aspect of the present invention, a correction value managing method, with regard to a test apparatus for testing the device under test, for managing a correction value to correct the timing at which the test signal is to be supplied to the device under test or a voltage level of the test signal to the device under test includes an identification information retrieving step of retrieving test module identification information, which is identification information of a test module, from the test module, wherein the test module includes a correcting unit for correcting the timing or the voltage level, a correction value holding unit for holding the correction value used for a correction by the correcting unit, and an identification information storing unit for storing the test module identification information, a correction value retrieving step of retrieving the correction value, which corresponds to the test module identification information obtained in the identification information retrieving step, from a correction value database, which stores the correction value to be held by the correction value holding unit of the test module identified by the test module identification information, a correction value holding step of causing the correction value holding unit to hold the correction value retrieved in the correction value retrieving step, and a test signal correcting step of causing the correcting unit to correct the test signal, using the correction value held by the correction value holding unit.

The correction value managing method may further include a correction value generating step of generating the correction value to be held by the correction value holding unit, a correction value storing step of storing the correction value generated in the correction value generating step into the correction value database, in order that the correction value corresponds to the test module identification information of the test module including the correction value holding unit, and an identification information storing step of storing the test module identification information into the identification information storing unit of the test module identified by the test module identification information.

According to a third aspect of the present invention, a computer program, with regard to a test apparatus for testing the device under test, instructs control means to control a correction on the timing at which the test signal is to be supplied to the device under test or a voltage level of the test signal to the device under test, wherein the control means functions as identification information retrieving means for retrieving test module identification information, which is identification information of a test module, from the test module, wherein the test module includes a correcting unit for correcting the timing or the voltage level, a correction value holding unit for holding the correction value used for a correction by the correcting unit, and an identification information storing unit for storing the test module identification information, correction value retrieving means for retrieving the correction value, which corresponds to the test module identification information obtained by the identification information retrieving means, from a correction value database, which stores the correction value to be held by the correction value holding unit of the test module identified by the test module identification information, correction value holding means for making the correction value holding unit hold the correction value retrieved by the correction value retrieving means, and test signal correcting means for making the correcting unit correct the test signal, using the correction value held by the correction value holding unit.

The summary of the invention does not necessarily describe all necessary features of the present invention. The present invention may also be a sub-combination of the features described above. The above and other features and advantages of the present invention will become more apparent from the following description of the embodiments taken in conjunction with the accompanying drawings.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
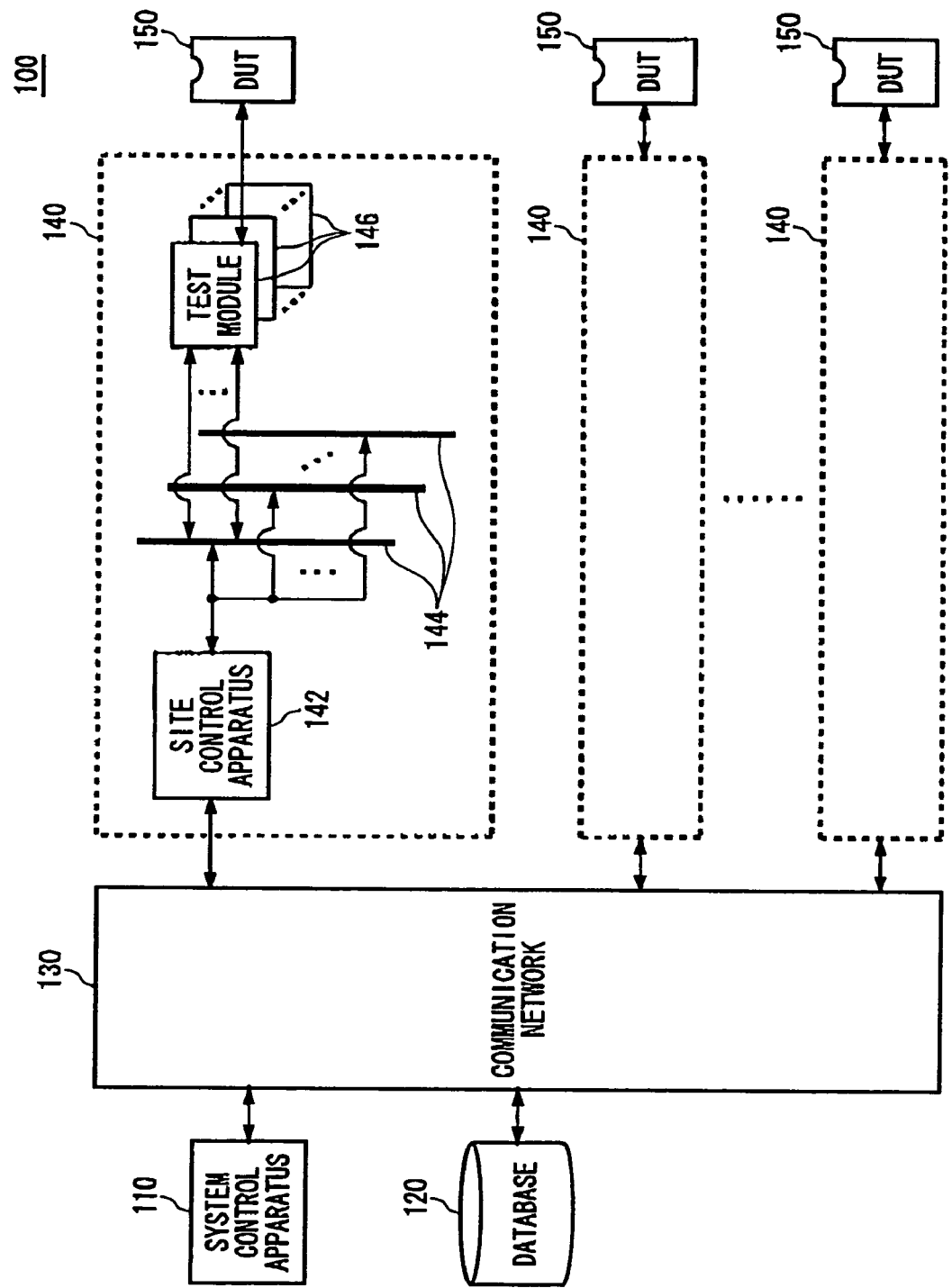
FIG. 1 shows an example of the whole configuration of a test apparatus 100.

FIG. 1 shows an example of the whole configuration of a test apparatus 100 related to an exemplary embodiment of this invention. The test apparatus 100 is realized by an open architecture, and a module based on the open architecture is used as a test module 146 for supplying a test signal to a DUT (Device Under Test) 150. The test module 146 generates the test signal, supplies it to the DUT 150, and judges the pass or fail of the DUT 150 by comparing an output signal output by the DUT 150 as the result of operation based on the test signal with an expected signal. An object of the test apparatus 100 of this embodiment is to perform the test of the DUT 150 with high precision using proper calibration data, which are used by the test modules 146 in the generation or comparison of the test signal, by automatically selecting and retrieving the calibration data from a database 120 based on various types of information stored in the test modules 146.

The test apparatus 100 includes a system control apparatus 110, a database 120, a communication network 130, and a plurality of site units 140. The system control apparatus 110 communicates with the database 120 and the plurality of site units 140 via the communication network 130. Moreover, the database 120 is an example of a correction value database of this invention, which may be a hard disk directly coupled to or internally built in the system control apparatus 110. In addition, each of the site units 140 includes a site control apparatus 142, a plurality of buses 144, and a plurality of test modules 146. The plurality of buses 144 are provided respectively to the plurality of test modules 146, and the site control apparatus 142 communicates with the plurality of test modules 146 via the respective buses 144.

The system control apparatus 110 controls a test sequence and a calibration sequence by way of the plurality of site units 140 based on both a test computer program and test data and a calibration program and calibration data stored in the database 120. The site control apparatus 142 controls the test sequence and the calibration sequence of the plurality of test modules 146 based on the control of the system control apparatus 110.

The system control apparatus 110 performs the calibration on the test modules 146 by executing the calibration program before the test of the DUT 150. Moreover, the database 120 stores the calibration data obtained by the calibration together with various types of information. Then, by performing the test computer program, the system control apparatus 110 selects and retrieves the calibration data stored in the database 120 based on the various types of information and supplies them to the test modules 146 via the site control apparatus 142 to make the test modules 146 hold the information.

The site control apparatus 142 obtains the test data from the database 120 via the system control apparatus 110 and stores the data in the test module 146 used in testing the DUT 150. Moreover, the site control apparatus 142 informs the test modules 146 of the start of the test based on the test computer program and the test data. Moreover, the site control apparatus 142 receives an interrupt indicating the end of the test from the test module 146 and makes each of the modules perform the next test based on the test result. The plurality of site control apparatus 142 may perform in parallel different test sequences for each of the plurality of DUTs 150, controlling the plurality of test modules 146 corresponding to the test results of each of the plurality of DUTs 150.

The plurality of test modules 146 are coupled to each of parts of a plurality of terminals of the DUT 150, performing the test of the DUT 150 based on the test computer program and the test data. In the test of the DUT 150, the test modules 146 generate the test signal from the test data based on the test sequence determined by the test computer program and supply it to the terminals of the DUT 150 respectively coupled to the test modules 146. Moreover, they obtain the output signal output by the DUT 150 as the result of the operation based on the test signal, compare it with an expected value, and store the comparison result. At this time, the test modules 146 improve the measurement accuracy in the generation or comparison of the test signal by using the calibration data supplied from the system control apparatus 110.

According to the test apparatus 100 of this embodiment, by managing the calibration data of the test modules 146 using various types of information, it is possible to perform the test using the calibration data, automatically supplying proper calibration data to the test modules 146, when the test is performed by the test modules 146. Accordingly, since the artificial miss in selecting the calibration data can be prevented, it is possible to improve measurement accuracy in the test and to accurately perform the test of the DUT 150.

Further, although it has been described in this embodiment that the system control apparatus 110 and the site control apparatus 142 are used as an example of control means of this invention, alternatively, each of the plurality of test modules 146 may include a module control apparatus. In addition, the system control apparatus 110, the site control apparatus 142 and the module control apparatus may function as the control means of this invention in a sharing or cooperating manner or a part of them may function as the control means of this invention.

Figure 2:
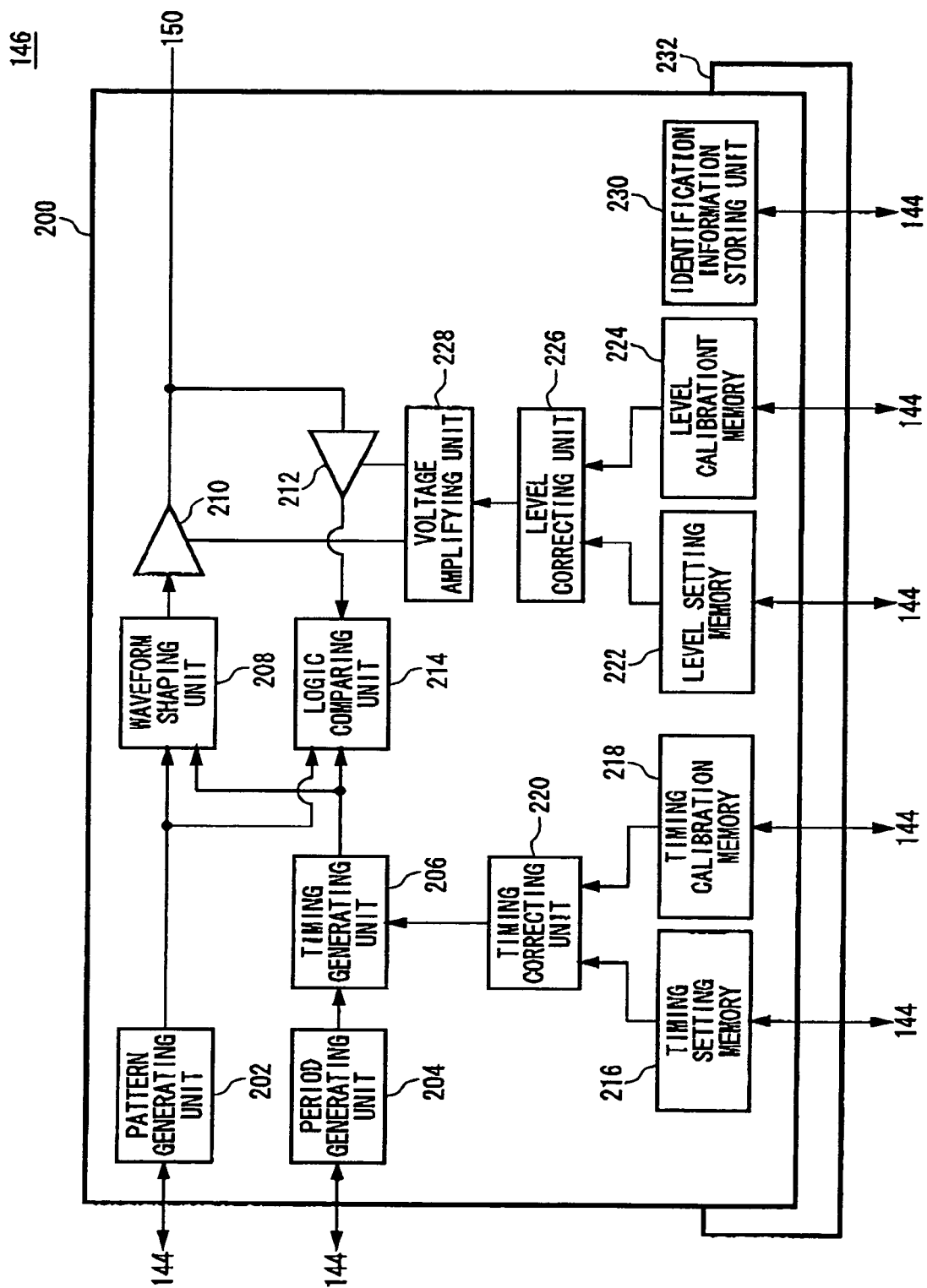
FIG. 2 shows an example of the functional configuration of a test module 146.

FIG. 2 shows an example of the functional configuration of the test module 146 of this embodiment. The test module 146 includes a test board 200, a pattern generating unit 202, a period generating unit 204, a timing generating unit 206, a waveform shaping unit 208, a driver 210, a comparator 212, a logic comparing unit 214, a timing setting memory 216, a timing calibration memory 218, a timing correcting unit 220, a level setting memory 222, a level calibration memory 224, a level correcting unit 226, a voltage amplifying unit 228, an identification information storing unit 230, and a slot 232.

The slot 232 detachably holds the test board 200, interfacing the communication between the test board 200 and the bus 144. The test board 200 are provided with the pattern generating unit 202, the period generating unit 204, the timing generating unit 206, the waveform shaping unit 208, the driver 210, the comparator 212, the logic comparing unit 214, the timing setting memory 216, the timing calibration memory 218, the timing correcting unit 220, the level setting memory 222, the level calibration memory 224, the level correcting unit 226, the voltage amplifying unit 228, and the identification information storing unit 230.

Further, the timing correcting unit 220 and the level correcting unit 226 are an example of a correcting unit of this invention, which corrects the characteristic of the test signal to be supplied to the DUT 150 or the characteristic of a measuring unit for measuring the output signal output from the DUT 150. Alternatively, in another embodiment where the test module 146 is an analog module, the correcting unit of this invention may be a filter frequency correcting unit for correcting a filtering frequency band of a filter for filtering the output signal output from the DUT 150.

In addition, the timing setting memory 216, the timing calibration memory 218, the level setting memory 222, and the level calibration memory 224 are volatile memories, which are a correction value holding unit of this invention. Moreover, the identification information storing unit 230 is a non-volatile memory. In addition, the comparator 212 is an example of a measuring unit of this embodiment.

First, before the test the DUT 150, the timing setting memory 216 holds timing data indicating predetermined timing used in the correction preformed by the timing correcting unit 220. The timing data is used to correct the difference of the characteristic of the timing generating unit 206, and it is set to be a value corresponding to the timing generating unit 206 as the system control apparatus 110 performs a device computer program. Moreover, the timing calibration memory 218 holds timing calibration data for the calibration of the timing data held by the timing setting memory 216, so that the test signal is supplied to the timing generating unit 206 with predetermined timing. The timing calibration data is obtained by performing timing calibration on the timing generating unit 206, retrieved from the database 120 by the system control apparatus 110 and set in the timing calibration memory 218. Further, the timing data and the timing calibration data are an example of a correction value of this invention.

Moreover, before the test of the DUT 150, the level setting memory 222 holds level data indicating a predetermined setting voltage used for the correction performed by the level correcting unit 226. The level data is used to correct the difference of the characteristics of the driver 210 and the comparator 212, and it is set to be a value corresponding to the driver 210 and the comparator 212 as the system control apparatus 110 performs the device computer program. In addition, the level calibration memory 224 holds level calibration data for the calibration on the level data held by the level setting memory 222, so that the driver 210 and the comparator 212 operate with a predetermined setting voltage. The level calibration data is obtained by performing level calibration on the driver 210 and the comparator 212, retrieved from the database 120 by the system control apparatus 110 and set in the level calibration memory 224. Further, the level data and the level calibration data are an example of the correction value of this invention.

The identification information storing unit 230 stores a system ID, which is the identification information of the test apparatus 100, aboard ID, which is the identification information of the test board 200, a slot ID, which is the identification information of the slot 232 holding the test board 200, etc., and the timing calibration data and the level calibration data, selected and retrieved from the database 120 based on the system ID, the board ID, and the slot ID by the system control apparatus 110, are respectively set in the timing calibration memory 218 and the level calibration memory 224. In another embodiment, the identification information storing unit 230 may store the timing calibration data and the level calibration data and respectively set them in the timing calibration memory 218 and the level calibration memory 224 before the test of the DUT 150.

When the test of the DUT 150 starts, the pattern generating unit 202 generates the test signal to be supplied to the DUT 150 based on the test data obtained from the system control apparatus 110 and supplies it to the waveform shaping unit 208 and the logic comparing unit 214. Then, the period generating unit 204 generates a reference period and supplies it to the timing generating unit 206. The timing generating unit 206 generates the timing at which the test signal is to be supplied to the DUT 150 and the timing at which the output signal from the DUT 150 is to be compared, based on the reference period generated by the period generating unit 204 and supplies it to the waveform shaping unit 208 and the logic comparing unit 214. At this time, the timing correcting unit 220 corrects the timing generated by the timing generating unit 206, that is, the timing for the supply of the test signal to the DUT 150 and the timing for the comparison of the test signal, based on the timing data held by the timing setting memory 216 and the timing calibration data held by the timing calibration memory 218.

The waveform shaping unit 208 shapes the test signal generated by the pattern generating unit 202 into a waveform to be applied to the DUT 150 and outputs it at the timing generated by the timing generating unit 206. The driver 210 amplifies the test signal, shaped into the waveform to be applied by the waveform shaping unit 208, to be a predetermined setting voltage supplied from the voltage amplifying unit 228 and sends it to the DUT 150. In addition, the comparator 212 receives the output signal from the DUT 150 corresponding to the test signal received from the driver 210 and outputs the result of comparing it with a threshold voltage supplied from the voltage amplifying unit 228 to the logic comparing unit 214. At this time, the level correcting unit 226 corrects the voltage level of the threshold voltage supplied to the driver 210 and the comparator 212 by way of the voltage amplifying unit 228, based on the level data held by the level setting memory 222 and the level calibration data held by the level calibration memory 224.

The logic comparing unit 214 compares the test signal supplied from the pattern generating unit 202 and the comparison result supplied from the comparator 212 with the timing supplied from the timing generating unit 206. Moreover, the logic comparing unit 214 stores the comparison result of the test signal and the output signal into a sequential fail memory. Moreover, the system control apparatus 110 judges the pass or fail of the DUT 150 by analyzing the comparison result stored in the fail memory after the end of the test sequence.

According to the test apparatus 100 related to this embodiment, since the system control apparatus 110 automatically retrieves and supplies the calibration data to be used by the timing correcting unit 220 and the level correcting unit 226 from the database 120 based on various types of information stored by the identification information storing unit 230 of the test module 146 and makes the timing calibration memory 218 and the level calibration memory 224 hold the calibration data, it is possible to prevent the calibration data from being falsely set. Accordingly, it is possible to perform the test of the DUT 150 with high precision using proper calibration data.

Figure 3:
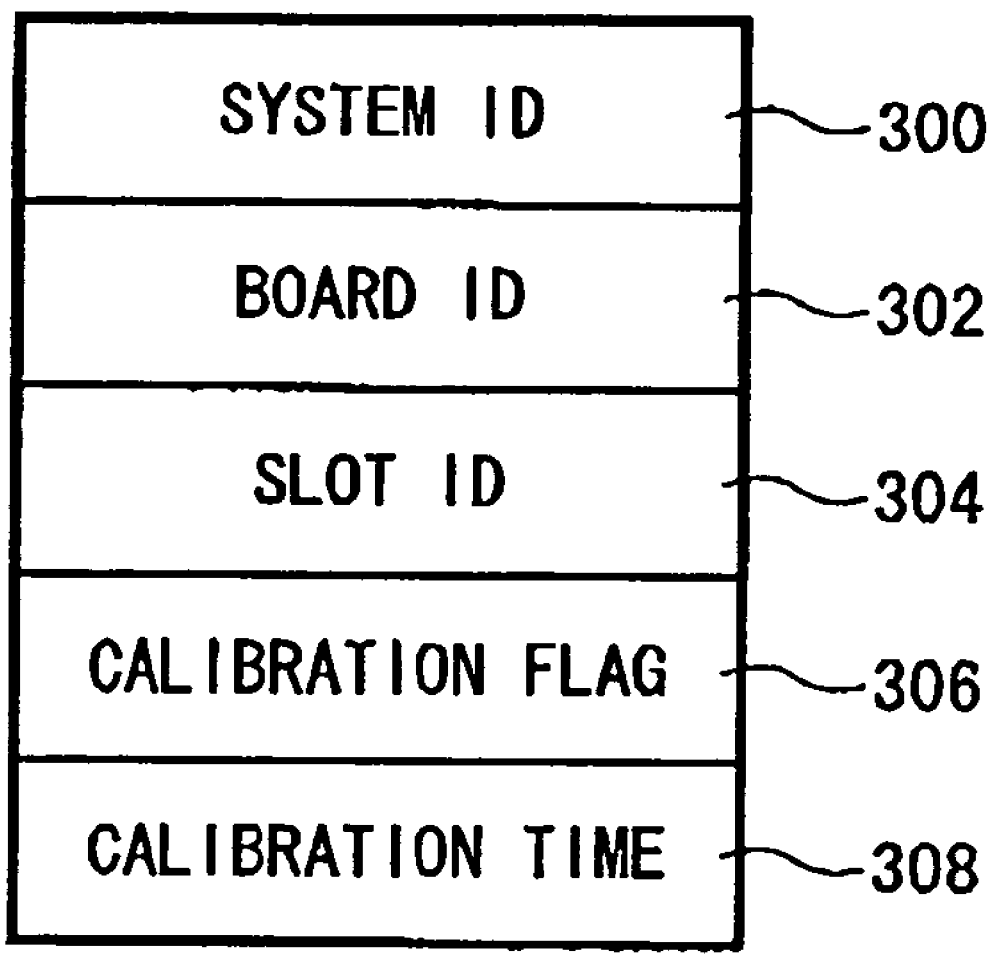
FIG. 3 shows an example of the data configuration of an identification information storing unit 230.

FIG. 3 shows an example of the data configuration of the identification information storing unit 230 related to this embodiment. The identification information storing unit 230 stores a system ID 300, aboard ID 302, a slot ID 304, a calibration flag 306, and a calibration time 308. The system ID 300 is an example of test apparatus identification information, which is the identification information of the test apparatus 100, uniquely assigned for each test apparatus 100 shown in FIG. 1. The board ID 302 is an example of test module identification information, which is the identification information of the test module 146, uniquely assigned to each test board 200 in the test apparatus 100. The slot ID 304 is an example of slot identification information, which is the identification information of the slot 232 held by the test board 200, wherein the slot 232 corresponding to the slot ID 304 held by the test board 200 is recognized by the system control apparatus 110 using the identification information of the bus 144, and the slot ID 304 is uniquely assigned for each slot 232 in the test apparatus 100.

Moreover, the calibration flag 306 is an example of an error flag of this invention, indicating whether there is an error or not in generating the timing calibration data to be held by the timing calibration memory 218 or the level calibration data to be held by the level calibration memory 224 with regard to the timing calibration of the timing generating unit 206 or the level calibration of the driver 210 or the comparator 212. The calibration time 308 is an example of a generation time of this embodiment, indicating the time when the timing calibration data to be held by the timing calibration memory 218 and the level calibration data to be held by the level calibration memory 224 are generated.

According to the test apparatus 100 related to this embodiment, as the identification information storing unit 230, a non-volatile memory, stores various types of information as above, it is possible to hold in advance various types of information even when the power of the test apparatus 100 is off. Therefore, when the power of the test apparatus 100 is applied again, it is possible to automatically retrieve the calibration data from the database 120 based on the various types of information stored by the identification information storing unit 230 and to perform the test of the DUT 150 with high precision using proper calibration data.

Figure 4:
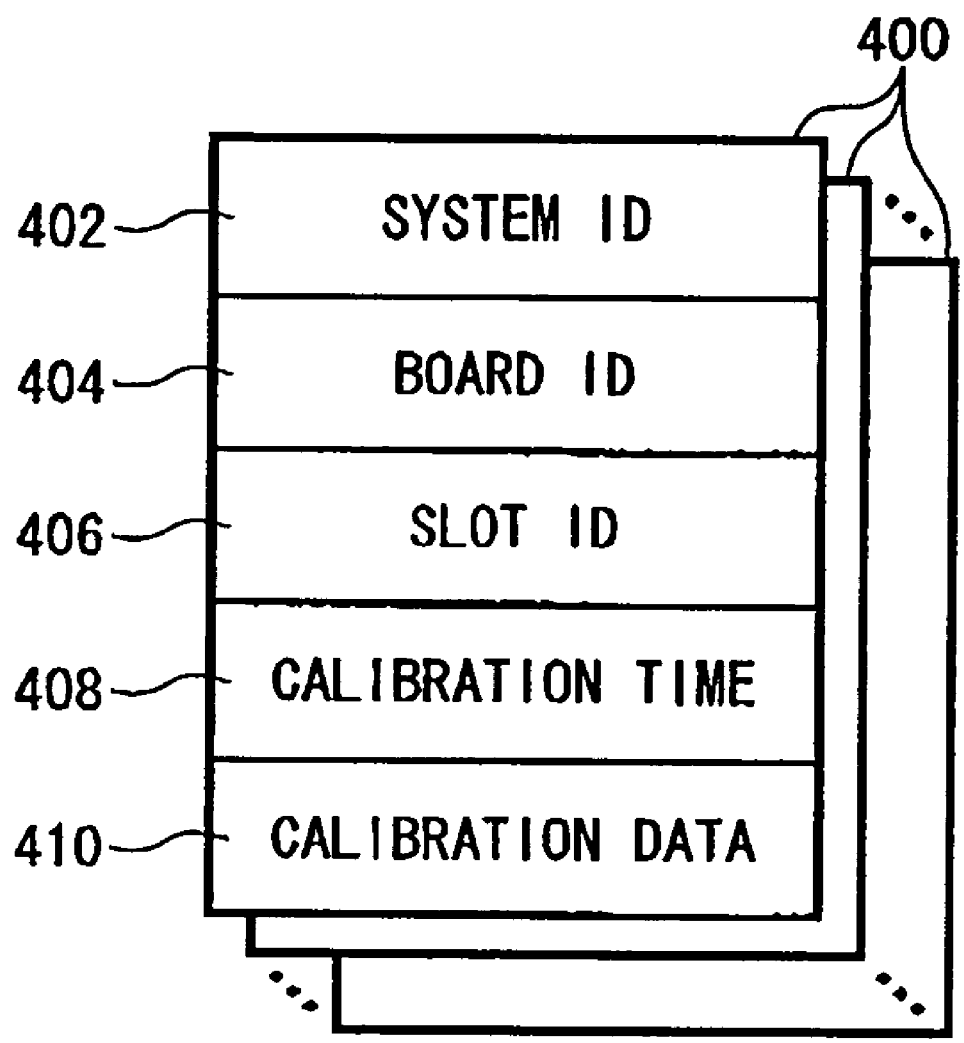
FIG. 4 shows an example of the data configuration of a database 120.

FIG. 4 shows an example of the data configuration of the database 120 related to this embodiment. The database 120 stores a plurality of calibration files 400 in which the system ID 402, the board ID 404, the slot ID 406, the calibration time 408, and the calibration data 410 correspond to each other. The database 120 stores the calibration files 400 in response to the plurality of test modules 146 included in each of the plurality of test apparatuses 100.

Each of the system ID 402, the board ID 404, the slot ID 406, and the calibration time 408 is the information indicating the same contents as the system ID 300, the board ID 302, the slot ID 304, the calibration flag 306, and the calibration time 308 shown in FIG. 3. The calibration data 410 includes the timing calibration data to be held by the timing calibration memory 218 included in the test module 146 identified by the system ID 300, the board ID 302, and the slot ID 304 and the level calibration data to be held by the level calibration memory 224.

According to the test apparatus 100 related to this embodiment, since the calibration data 410 is automatically selected and retrieved based on the above various types of information, it is possible to prevent from holding certain calibration data 410 different from the calibration data 410 to be held by the timing calibration memory 218 and the level calibration memory 224, even when the test board 200 is falsely inserted into a test apparatus 100 different from the desired test apparatus 100 or into a slot 232 different from the desired slot 232.

Figure 5:
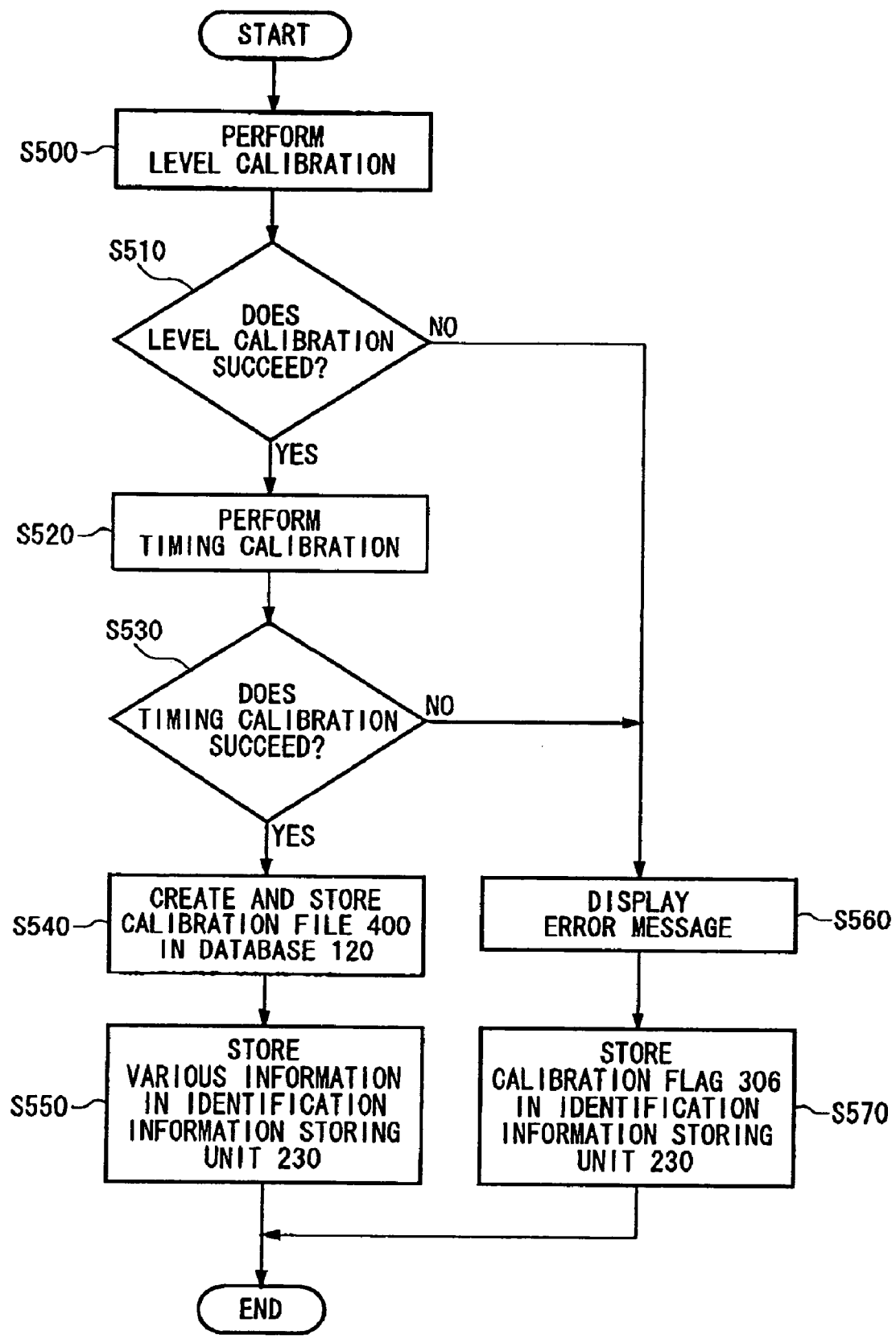
FIG. 5 shows an example of a generation process of calibration data 410.

FIG. 5 shows an example of a generation process of the calibration data 410 related to this embodiment. The generation process of the calibration data 410 shown in FIG. 5 is a part of the correction value managing method of this invention. First, the system control apparatus 110 performs the level calibration to adjust the setting voltage of the driver 210 and the comparator 212 by performing the calibration program and generating the level calibration data (S500). Then, if the level calibration data has been successfully generated without an error (S510: Yes), the system control apparatus 110 performs the timing calibration to adjust the timing generated by the timing generating unit 206 and generates the timing calibration data (S520).

Then, if the timing calibration data has been successfully generated with out an error in the timing calibration (S530: Yes), the system control apparatus 110 creates the calibration file 400 based on the various types of information obtained in the level calibration and the timing calibration and stores it in the database 120 (S540). In detail, the system control apparatus 110 generates and stores the calibration file 400 in the database 120, wherein the board ID 404 of the test module 146 performing the calibration, the system ID 402 of the test apparatus 100 including the concerning test module 146, the slot ID 406 of the slot 232 holding the test board 200 of the test modules 146, the calibration data 410 indicating the calibration time 308 indicating the time when the calibration is performed correspond to each other.

Moreover, the system control apparatus 110 stores the system ID 300, the board ID 302, the slot ID 304, and the calibration time 308, which indicate the same contents as the system ID 402, the board ID 404, the slot ID 406, and the calibration time 408 of the calibration file 400 stored in the database 120 in the process of S540, and the calibration flag 306 indicating that the calibration is normally finished in the identification information storing unit 230 included in the test module 146 identified by the board ID 302 (S550).

Meanwhile, if the level calibration data fails to be generated with an error occurring in the level calibration (S510: No), or if the timing calibration data fails to be generated with an error occurring in the timing calibration (S530: No), the system control apparatus 110 informs a user that the calibration is not normally finished by displaying an error message on a display device (S560). Moreover, the system control apparatus 110 stores a calibration flag 306, which indicates that the calibration has not been normally performed and an error has occurred in generating the calibration data 410, in the identification information storing unit 230 (S570).

Figure 6:
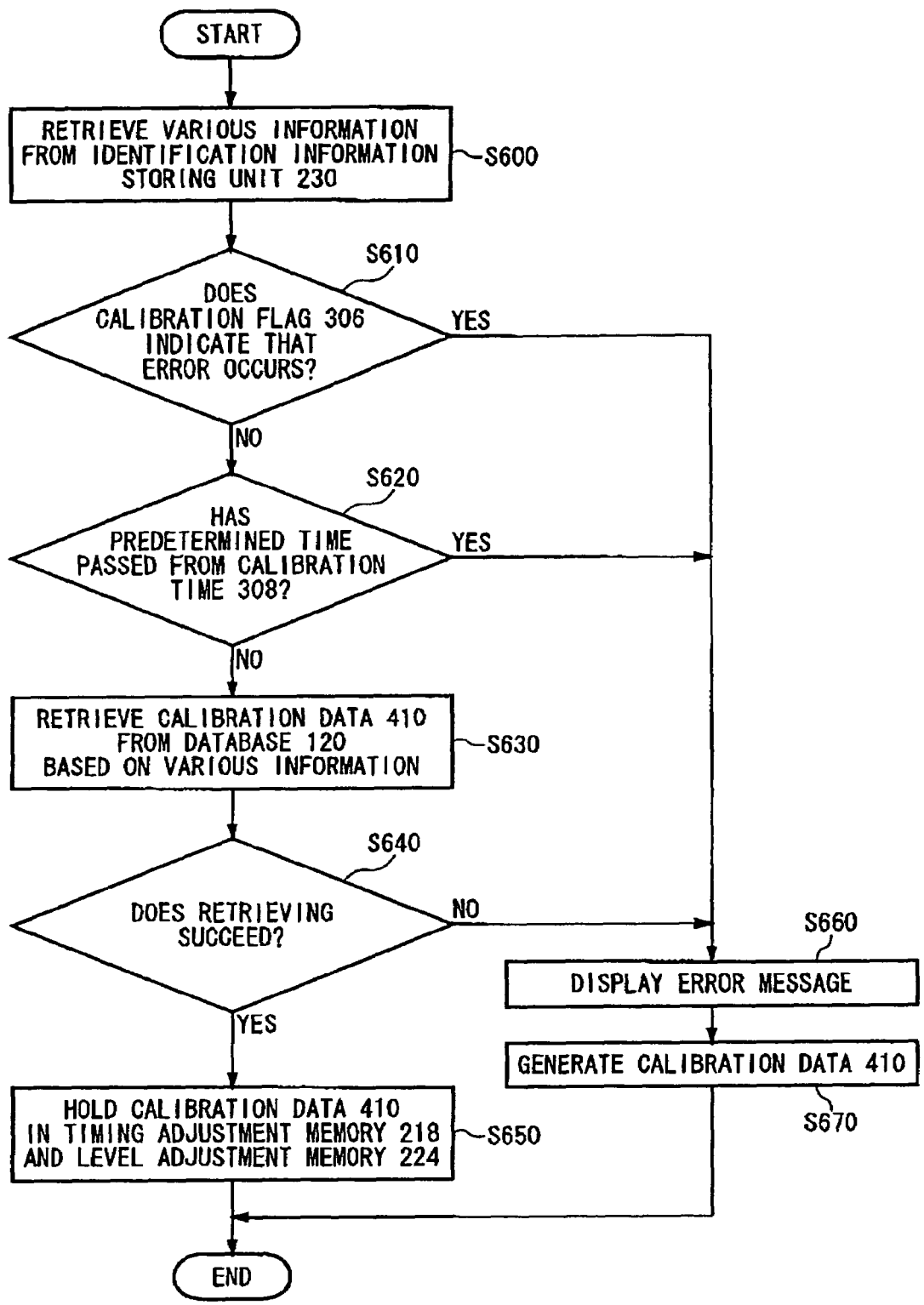
FIG. 6 shows an example of a retrieving process of the calibration data 410.

As above, by storing various types of information in the database 120 and the identification information storing unit 230, it is possible to select and retrieve the calibration data 410, which is proper to the test module 146, from the database 120 in the retrieving process of the calibration data 410 shown in FIG. 6. Moreover, since the identification information storing unit 230 stores the calibration flag 306 and whether the proper calibration data 410 exists or not is clearly recorded in advance, it is possible to prevent from using certain improper calibration data 410.

FIG. 6 shows an example of the retrieving process of the calibration data 410 related to this embodiment. The retrieving process of the calibration data 410 shown in FIG. 6 is apart of the correction value managing method of this invention. First, the system control apparatus 110 retrieves the various types of information from the identification information storing unit 230 (S600). In detail, the system control apparatus 110 retrieves the system ID 300, the board ID 302, the slot ID 304, the calibration flag 306, and the calibration time 308. Moreover, the system control apparatus 110 judges whether an error has occurred or not in generating the calibration data 410, based on the calibration flag 306 retrieved from the identification information storing unit 230 (S610). Moreover, if the calibration flag 306 indicates that the calibration is normally finished (S610: No), the system control apparatus 110 judges whether the calibration data 410 is still effective or not based on the calibration time 308 retrieved from the identification information storing unit 230 (S620).

If a predetermined period of time has not passed yet from the calibration time 308 as the system control apparatus 110 compares the calibration time 308 with the present time (S620: No), the system control apparatus 110 considers that the calibration data 410 is effective, selects the calibration file 400 based on the various types of information retrieved from the identification information storing unit 230, and retrieves the calibration data 410 from the database 120 (S630). In detail, the system control apparatus 110 selects the calibration file 400 including the system ID 402, the board ID 404, the slot ID 406, and the calibration time 408, which indicate the same contents as the system ID 300, the board ID 302, the slot ID 304, and the calibration time 308 retrieved from the identification information storing unit 230. Moreover, it retrieves the calibration data 410 stored in the database 120, wherein the calibration data 410 corresponds to the system ID 402, the board ID 404, the slot ID 406, and the calibration time 408.

In S630, if the desired calibration data 410 is successfully retrieved as the calibration file 400 including the system ID 402, the board ID 404, the slot ID 406, and the calibration time 408 which indicate the same contents as the system ID 300, the board ID 302, the slot ID 304, and the calibration time 308 retrieved from the identification information storing unit 230 exist in the database 120 (S640: Yes), the system control apparatus 110 makes the timing calibration memory 218 and the level calibration memory 224 respectively hold the timing calibration data and the level calibration data included in the calibration data 410 retrieved (S650).

Moreover, with regard to the test module 146, the timing correcting unit 220 adjusts the timing generated by the timing generating unit 206 based on the timing calibration data held in the timing calibration memory 218. In addition, the level correcting unit 226 adjusts the voltage supplied to the driver 210 and the comparator 212 by the voltage amplifying unit 228 based on the level calibration data held in the level calibration memory 224. Moreover, the test of the DUT 150 is performed.

Meanwhile, if the calibration flag 306 indicates that an error has occurred in generating the calibration data 410 (S610: Yes), or if a predetermined period of time has passed from the calibration time 308 (S620: Yes), the database 120 does not store in advance the calibration file 400 including the system ID 402, the board ID 404, the slot ID 406, and the calibration time 408 which indicate the same contents as the system ID 300, the board ID 302, the slot ID 304, and the calibration time 308 retrieved from the identification information storing unit 230, and if the desired calibration data 410 fails to be retrieved (S640), the system control apparatus 110 informs a user that it cannot obtain the calibration data 410 by displaying an error message on a display device (S660). Moreover, the system control apparatus 110 generates new calibration data 410 and stores it in the database 120 by performing the generating process of the calibration data 410 shown in FIG. 5 (S670). Moreover, the retrieving process of the calibration data 410 shown in FIG. 6 may be performed again, so that the timing calibration data and the level calibration data included in the calibration data 410 can be respectively held in the timing calibration memory 218 and the level calibration memory 224.

As above, by managing the calibration data 410 using various types of information such as the system ID 402, the board ID 404, the slot ID 406, the calibration time 408, etc., it is possible to perform the test, automatically supplying proper calibration data 410 to the test module 146. In addition, even when a predetermined period of time has passed from the calibration time 308, it is possible to accurately perform the test of the DUT 150, maintaining high precision all the time, because new calibration data 410 is generated without using the previous calibration data 410 so that the decrease of measurement accuracy due to the deterioration of the test module 146 can be restricted.

Figure 7:
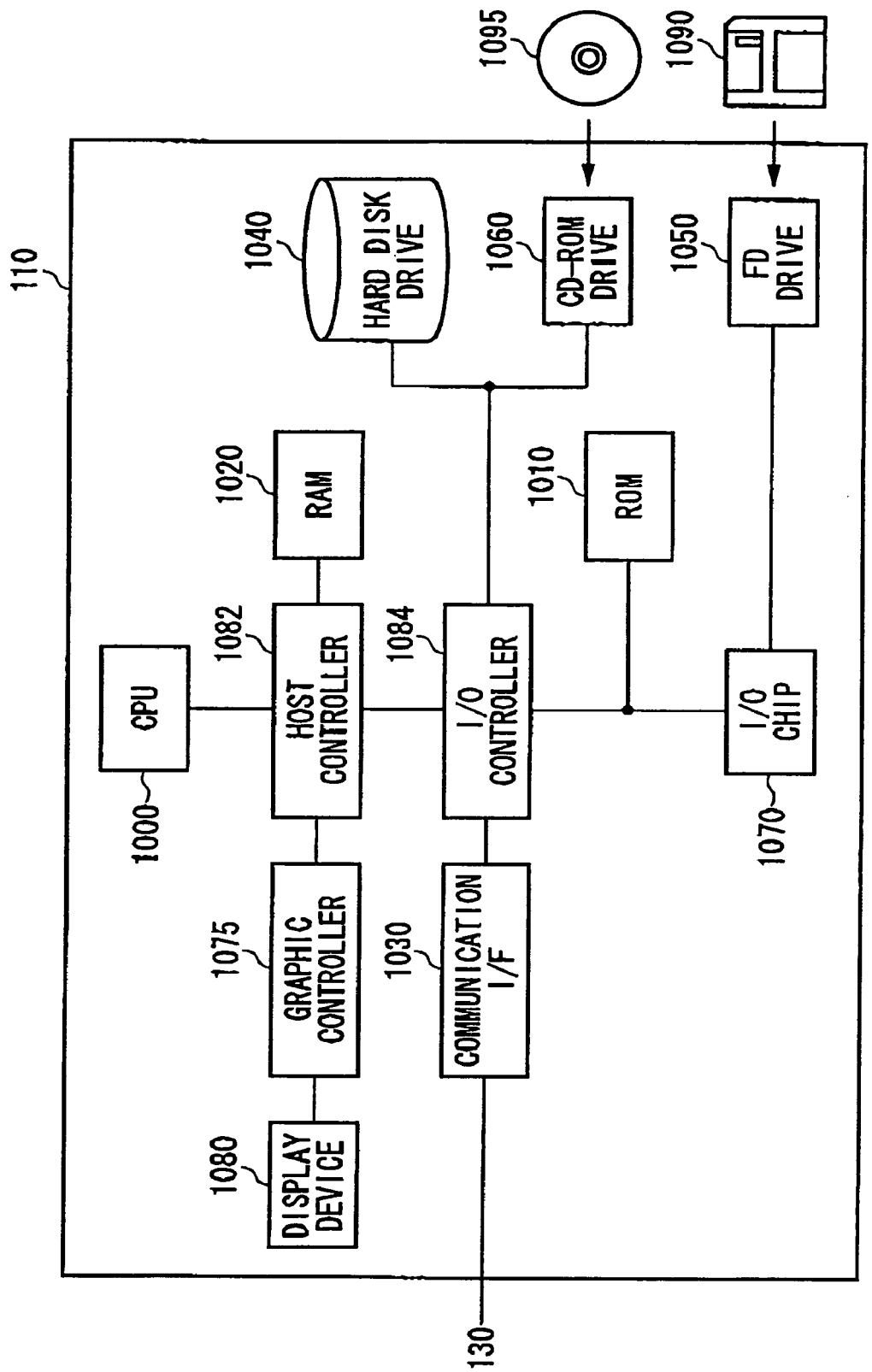
FIG. 7 shows an example of a hardware configuration of a system control apparatus 110.

FIG. 7 shows an example of a hardware configuration of the system control apparatus 110 related to this embodiment. The system control apparatus 110 includes a CPU peripheral unit including a CPU 1000, a RAM 1020, a graphic controller 1075, and a display device 1080, which are coupled to each other by a host controller 1082, an input-output unit including a communication interface 1030, a hard disk drive 1040 and a CD-ROM drive 1060, which are coupled to the host controller 1082 by an input-output controller 1084, and a ROM 1010, a flexible disk drive 1050 and an input-output chip 1070 which are coupled to the input-output controller 1084.

The host controller 1082 couples the CPU 1000 and the graphic controller 1075, which access to the RAM 1020 with a high transfer rate, to the RAM. The CPU 1000 operates based on a computer program stored in the ROM 1010 and the RAM 1020 and controls each unit. The graphic controller 1075 obtains image data generated on a frame buffer provided inside the RAM 1020 by the CPU 1000 and displays it on the display device 1080. Alternatively, the graphic controller 1075 may include a frame buffer for storing the image data generated by the CPU 1000.

The input-output controller 1084 couples the communication interface 1030, a hard disk drive 1040, and the CD-ROM drive 1060, which operate at a relatively low speed, to the host controller 1082. The communication interface 1030 communicates with other apparatuses via the communication network 130. The hard disk drive 1040 stores a computer program and data used by the system control apparatus 110. The CD-ROM drive 1060 reads the computer program or the date from the CD-ROM 1095 and provides it to the input-output chip 1070 via the RAM 1020.

Moreover, the relatively slow input-output devices such as the flexible disk drive 1050a and the input-output chip 1070 and the ROM 1010 are coupled to the input-output controller 1084. The ROM 1010 stores a boot program executed by the CPU 1000 when the system control apparatus 110 operates or a program depending on the hardware of the system control apparatus 110. The flexible disk drive 1050 reads the program or data from a flexible disk 1090 and provides it to the input-output chip 1070 via the RAM 1020. The input-output chip 1070 couples various input-output devices via a parallel port, a serial port, a keyboard port, a mouse port, etc.

The computer program provided to the system control apparatus 110 is provided by a user, being stored on a recording medium such as a flexible disk 1090, a CD-ROM 1095, or an IC card, etc. The computer program is read from the recording medium, installed in the system control apparatus 110 via the input-output chip 1070, and executed in the system control apparatus 110.

The computer program installed and executed by the system control apparatus 110 instructs the system control apparatus 110 to function as identification information retrieving means for retrieving the system ID 300, the board ID 302, the slot ID 304, the calibration flag 306, and the calibration time 308 stored by the identification information storing unit 230, correction value retrieving means for retrieving the calibration data 410 from the database 120, where the calibration data 410 is stored in a corresponding manner to the system ID 402, the board ID 404, the slot ID 406, and the calibration time 408 having the same contents as the system ID 300, the board ID 302, the slot ID 304, the calibration flag 306, and the calibration time 308 obtained by the identification information retrieving means, correction value holding means for making the timing calibration memory 218 and the level calibration memory 224 respectively hold the timing calibration and the level calibration data included in the calibration data 410 retrieved by the correction value retrieving means, and test signal correcting means for making the timing correcting unit 220 and the level correcting unit 226 correct the test signal using the timing calibration data and the level calibration data respectively held by the timing calibration memory 218 and the level calibration memory 224.

The above computer program or modules may be stored on an external storage medium. As the storage medium, there can be, in addition to the flexible disk 1090 and the CD-ROM 1095, an optical recording medium such as a DVD or PD, a magneto-optical recording medium such as an MD, a tape medium, a semiconductor memory such as an IC card, etc. Moreover, using a memory such as a hard disk drive or a RAM built in a server system coupled to a dedicated communication network or the Internet, the computer program may be provided to the system control apparatus 110 via the communication network 130.

As obvious from the description above, according to the present invention, by properly correcting the timing at which the test signal is to supplied to the device under test or the voltage level of the test signal to the device under test, it is possible to accurately test the device under test, maintaining high measurement accuracy.

Although the present invention has been described by way of exemplary embodiments, it should be understood that those skilled in the art might make many changes and substitutions without departing from the spirit and the scope of the present invention which is defined only by the appended claims.

What is claimed is:

1. A test apparatus for testing a device under test, comprising:
   a test module comprising:
      a correcting unit for correcting a characteristic of a test signal to be supplied to said device under test or a characteristic of a measuring unit for measuring an output signal output from said device under test;
      a correction value holding unit for holding a correction value used for a correction by said correcting unit; and
      an identification information storing unit for storing test module identification information, which is identification information of said test module;
   a correction value database for storing said correction value to be held by said correction value holding unit of said test module identified by said test module identification information, in order that said correction value corresponds to said test module identification information; and
   control means for retrieving said correction value stored by said correction value database, wherein said correction value corresponds to said test module identification information stored by said identification information storing unit, and controlling said correction value holding unit to hold said correction value.

2. A test apparatus as claimed in claim 1, wherein said correcting unit corrects timing at which said test signal is to be supplied to said device under test or a voltage level of said test signal to said device under test.

3. A test apparatus as claimed in claim 2, wherein
   said test module further comprises a timing generating unit for generating said timing at which said test signal is to be supplied to said device under test,
   said correction value holding unit comprises:
      a timing setting memory for holding timing data indicating predetermined timing; and
      a timing calibration memory for holding timing calibration data to adjust said timing data, so that said test signal can be supplied to said timing generating unit at said predetermined timing, and
   said correcting unit comprises a timing correcting unit for correcting said timing generated by said timing generating unit, based on said timing data and said timing calibration data as said correction value.

4. A test apparatus as claimed in claim 2, wherein
   said test module further comprises a driver for transferring said test signal to said device under test or a comparator for receiving said output signal from said device under test,
   said correction value holding unit comprises:
      a level setting memory for holding level data indicating a predetermined setting voltage; and
      a level calibration memory for holding level calibration data to adjust said level data, so that said driver or comparator can operate with said predetermined setting voltage, and
   said correcting unit comprises a level correcting unit for correcting said setting voltage of said driver or comparator based on said level data and said level calibration data as said correction value.

5. A test apparatus as claimed in claim 2, wherein
   said identification information storing unit further stores test apparatus identification information which is identification information of said test apparatus,
   said correction value database stores said correction value in order that said correction value corresponds to said test module identification information and said test apparatus identification information, and
   said control means retrieves said correction value stored by said correction value database, wherein said correction value corresponds to said test module identification information and said test apparatus identification information stored by said identification information storing unit, and controls said correction value holding unit to hold said correction value.

6. A test apparatus as claimed in claim 2, wherein
   said correcting unit further comprises a plurality of slots for detachably holding a test board on which said correction value holding unit and said identification information storing unit are provided,
   said identification information storing unit further stores slot identification information which is identification information of said slot holding said test board,
   said correction value database stores said correction value in order that said correction corresponds to said test module identification information and said slot identification information, and
   said control means retrieves said correction value stored by said correction value database, wherein said correction value corresponds to said slot identification information and said test apparatus identification information stored by said identification information storing unit, and controls said correction value holding unit to hold said correction value.

7. A test apparatus as claimed in claim 2, wherein
   said identification information storing unit further stores an error flag indicating whether an error occurs or not in generating said correction value to be held by said correction value holding unit, and
   said control means generates a new correction value if said identification information storing unit stores said error flag indicating that an error has occurred in generating said correction value, when said correction value is retrieved from said correction value database based on said test module identification information stored by said identification information storing unit.

8. A test apparatus as claimed in claim 2, wherein
   said identification information storing unit further stores a generation time indicating the time when said correction value to be held by said correction value holding unit is generated, and
   said control means generates a new correction value if a predetermined period of time has passed from said generation time, when said correction value is retrieved from said correction value database based on said test module identification information stored by said identification information storing unit.

9. A test apparatus as claimed in claim 2, wherein said control means generates a new correction value, when said correction value corresponding to said test module identification information stored by said identification information storing unit is not stored in said correction value database.

10. A test apparatus as claimed in claim 2, wherein
    said correction value holding unit is a volatile memory, and
    said identification information storing unit is a non-volatile memory.

11. A correction value managing method, with regard to a test apparatus for testing said device under test, for managing a correction value to correct a characteristic of a test signal to be supplied to a device under test or a characteristic of a measuring unit for measuring an output signal output from said device under test, comprising:

an identification information retrieving step of retrieving test module identification information, which is identification information of a test module, from said test module, wherein said test module comprises:

a correcting unit for correcting said characteristic of said test signal or said measuring unit;

a correction value holding unit for holding said correction value used for a correction by said correcting unit; and an identification information storing unit for storing said test module identification information, a correction value retrieving step of retrieving said correction value, which corresponds to said test module identification information obtained in said identification information retrieving step, from a correction value database, which stores said correction value to be held by said correction value holding unit of said test module identified by said test module identification information;

a correction value holding step of causing said correction value holding unit to hold said correction value retrieved in said correction value retrieving step; and a test signal correcting step of causing said correcting unit to correct said test signal, using said correction value held by said correction value holding unit.

12. A correction value managing method as claimed in claim 11, further comprising:

a correction value generating step of generating said correction value to be held by said correction value holding unit;

a correction value storing step of storing said correction value generated in said correction value generating step into said correction value database, in order that said correction value corresponds to said test module identification information of said test module comprising said correction value holding unit; and an identification information storing step of storing said test module identification information into said identification information storing unit of said test module identified by said test module identification information.

13. A computer program, with regard to a test apparatus for testing said device under test, for instructing control means to control a correction on a characteristic of a test signal to be supplied to a device under test or a characteristic of a measuring unit for measuring an output signal output from said device under test, wherein said control means comprises:

identification information retrieving means for retrieving test module identification information, which is identification information of a test module, from said test module, wherein said test module comprises:

a correcting unit for correcting said characteristic of said test signal or said measuring unit;

a correction value holding unit for holding said correction value used for a correction by said correcting unit; and an identification information storing unit for storing said test module identification information;

correction value retrieving means for retrieving said correction value, which corresponds to said test module identification information obtained by said identification information retrieving means, from a correction value database, which stores said correction value to be held by said correction value holding unit of said test module identified by said test module identification information:

correction value holding means for making said correction value holding unit hold said correction value retrieved by said correction value retrieving means; and test signal correcting means for making said correcting unit correct said test signal, using said correction value held by said correction value holding unit.

* * * * *